US008002511B2

(12) United States Patent
Kamikawa et al.

(10) Patent No.: US 8,002,511 B2
(45) Date of Patent: Aug. 23, 2011

(54) BATCH FORMING APPARATUS, SUBSTRATE PROCESSING SYSTEM, BATCH FORMING METHOD, AND STORAGE MEDIUM

(75) Inventors: Yuji Kamikawa, Tosu (JP); Koji Egashira, Tosu (JP)

(73) Assignee: Tokyo Electron Limited, Tokyo (JP)

( * ) Notice: Subject to any disclaimer, the term of this patent is extended or adjusted under 35 U.S.C. 154(b) by 664 days.

(21) Appl. No.: 11/585,337

(22) Filed: Oct. 24, 2006

(65) Prior Publication Data
US 2009/0010748 A1 Jan. 8, 2009

(30) Foreign Application Priority Data

Oct. 28, 2005 (JP) ................................ 2005-314409

(51) Int. Cl.
*B65G 49/07* (2006.01)
(52) U.S. Cl. .............. 414/416.02; 414/404; 414/416.08; 414/811; 414/938
(58) Field of Classification Search ............. 414/416.02, 414/811, 938, 404, 416.08, 416.11, FOR. 107
See application file for complete search history.

(56) References Cited

U.S. PATENT DOCUMENTS

| | | | | | |
|---|---|---|---|---|---|
| 3,949,891 | A | * | 4/1976 | Butler et al. .................. | 414/405 |
| 5,125,784 | A | * | 6/1992 | Asano ........................... | 414/404 |
| 5,153,841 | A | * | 10/1992 | Goff et al. .................... | 700/228 |
| 6,055,694 | A | * | 5/2000 | Steere .......................... | 414/938 |
| 6,092,971 | A | * | 7/2000 | Balg et al. ................. | 414/416.03 |
| 6,345,947 | B1 | * | 2/2002 | Egashira .................. | 414/225.01 |
| 6,354,794 | B2 | * | 3/2002 | Sato et al. .................... | 414/811 |
| 6,543,982 | B1 | * | 4/2003 | Nichols et al. ........... | 414/331.16 |
| 6,612,801 | B1 | * | 9/2003 | Koguchi ................... | 414/416.02 |
| 2001/0048867 | A1 | * | 12/2001 | Lebar et al. .................... | 414/217 |
| 2003/0164179 | A1 | | 9/2003 | Kamikawa et al. | |
| 2004/0026694 | A1 | * | 2/2004 | Blattner et al. ................. | 257/48 |

FOREIGN PATENT DOCUMENTS

| | | | | | |
|---|---|---|---|---|---|
| JP | 62-33437 | A | * | 2/1987 | .................... 414/938 |
| JP | 11-354604 | | | 12/1999 | |
| JP | 2002-64075 | | | 2/2002 | |
| JP | 2002-064075 | | | 2/2002 | |
| JP | 2003-257923 | | | 9/2003 | |
| JP | 2005-85896 | | | 3/2005 | |
| WO | WO 00/03417 | | * | 1/2000 | |

* cited by examiner

*Primary Examiner* — James Keenan
(74) *Attorney, Agent, or Firm* — Smith, Gambrell & Russell, LLP

(57) ABSTRACT

A batch forming apparatus forms a batch of substrates by combining a plurality of substrates that have been taken out from a plurality of carriers each containing therein the substrates in a stacked manner. The batch forming apparatus includes: a substrate transfer mechanism that takes out the substrates from each carrier and transfer the substrates; a substrate relative positional relationship changing mechanism that rearranges one or more substrates out of the substrates transferred by the substrate transfer mechanism one by one relative to other substrates to change positional relationships of the substrates relative to each other; and a batch forming mechanism that forms a batch of substrates out of the substrates that have been transferred thereto by the substrate transfer mechanism, with positional relationships of the substrates having been changed relative to each other by the substrate relative positional relationship changing mechanism. A substrate processing system includes such a batch forming apparatus, and a substrate processing apparatus that process the batch of substrates formed by the batch forming apparatus.

29 Claims, 8 Drawing Sheets

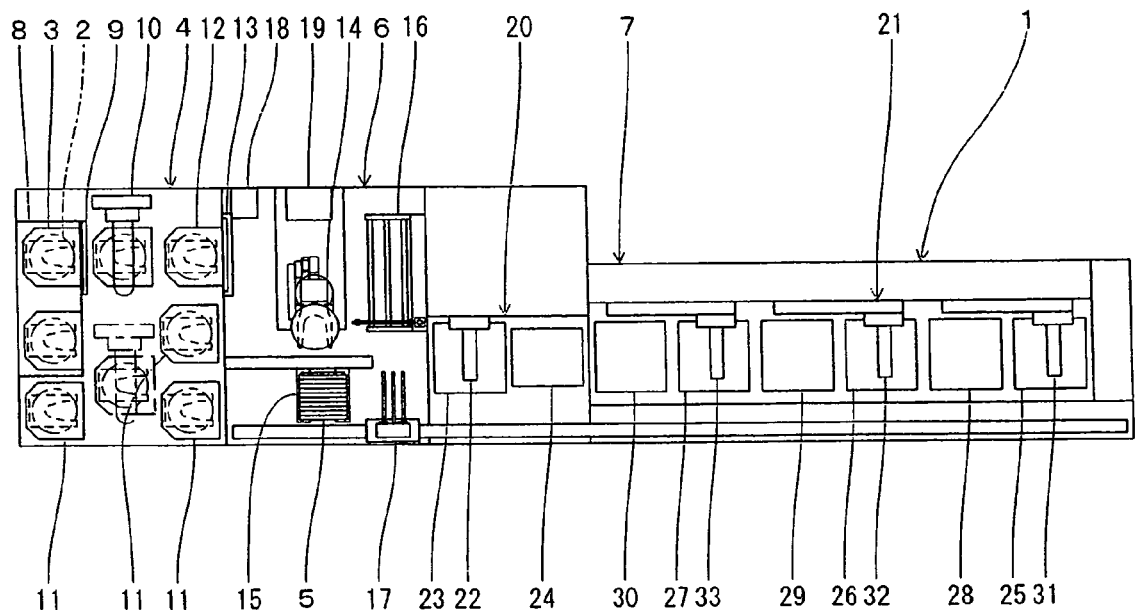
F I G. 1
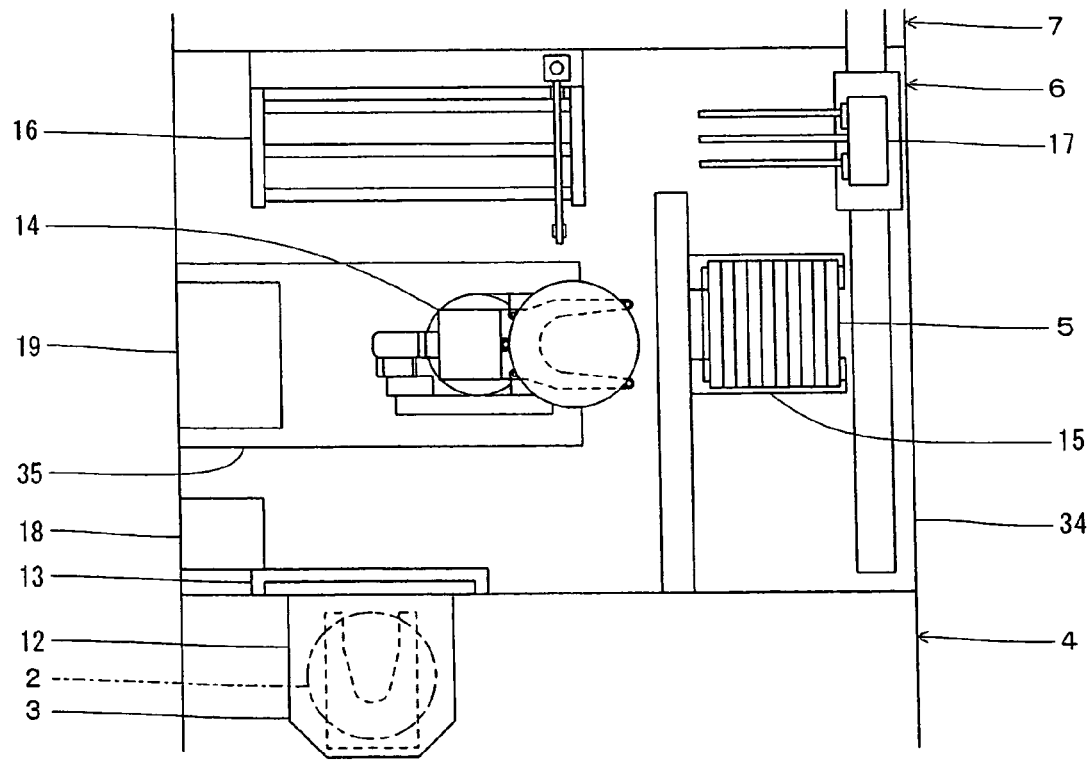
F I G. 2

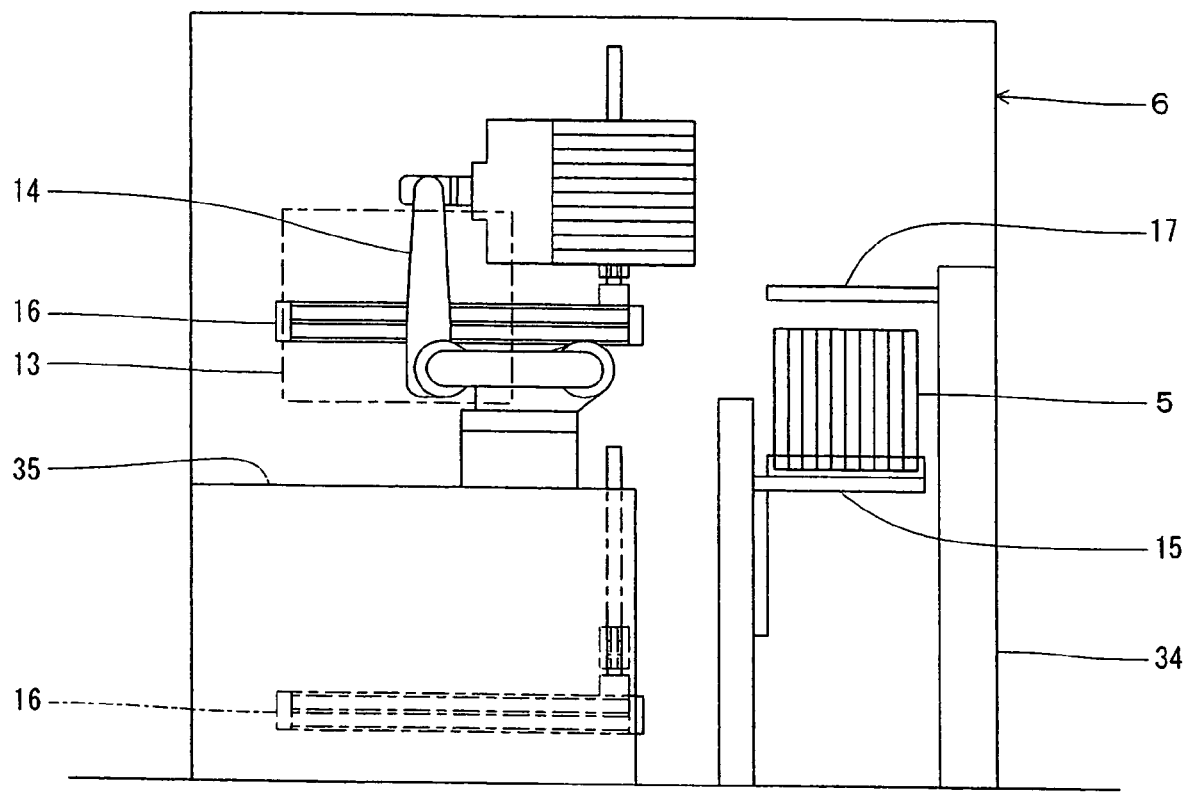
F I G. 3
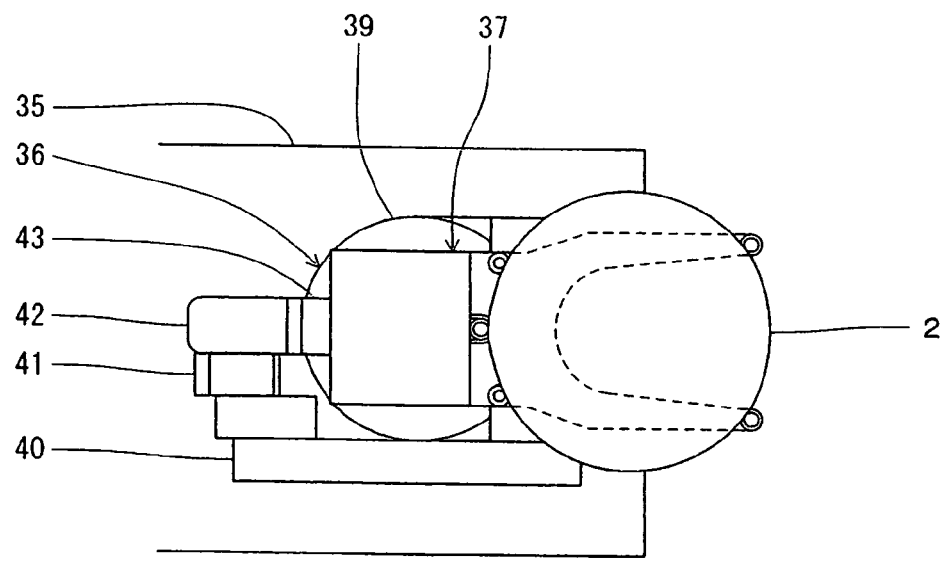
F I G. 4

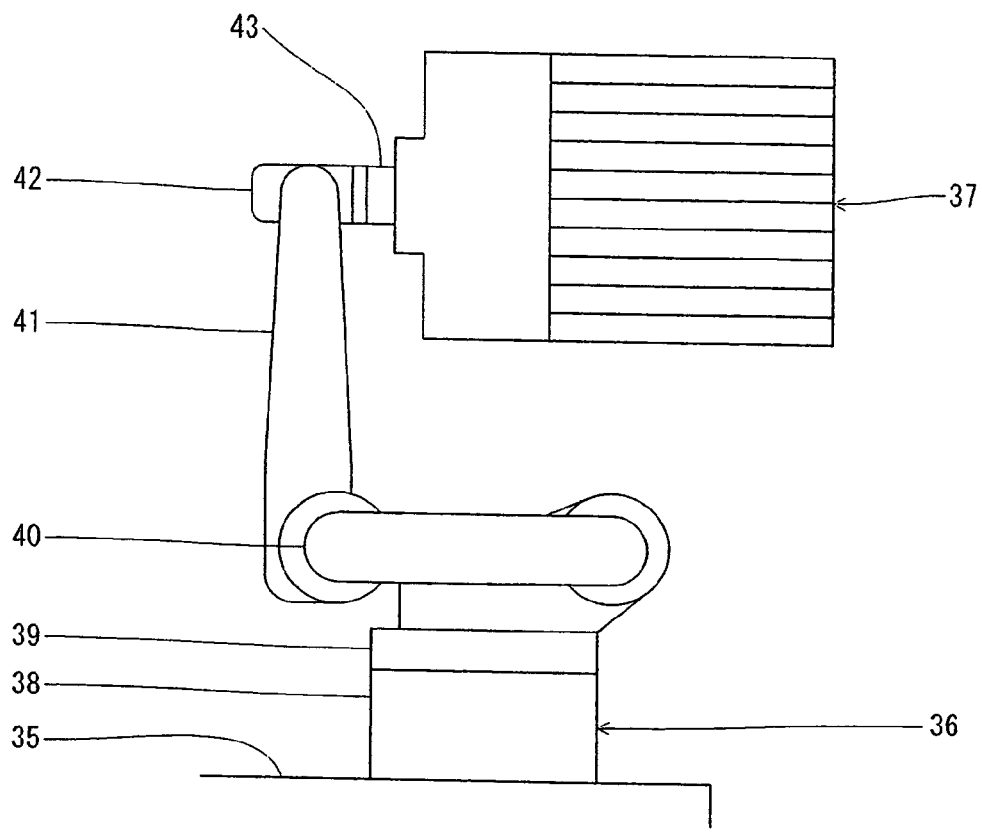
F I G. 5
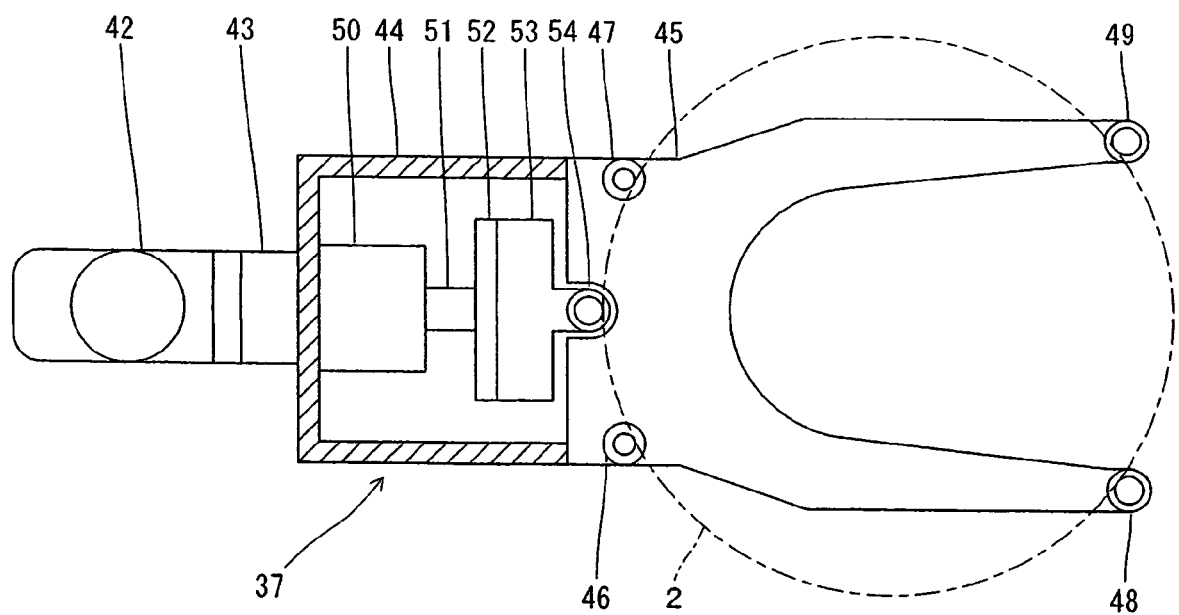
F I G. 6

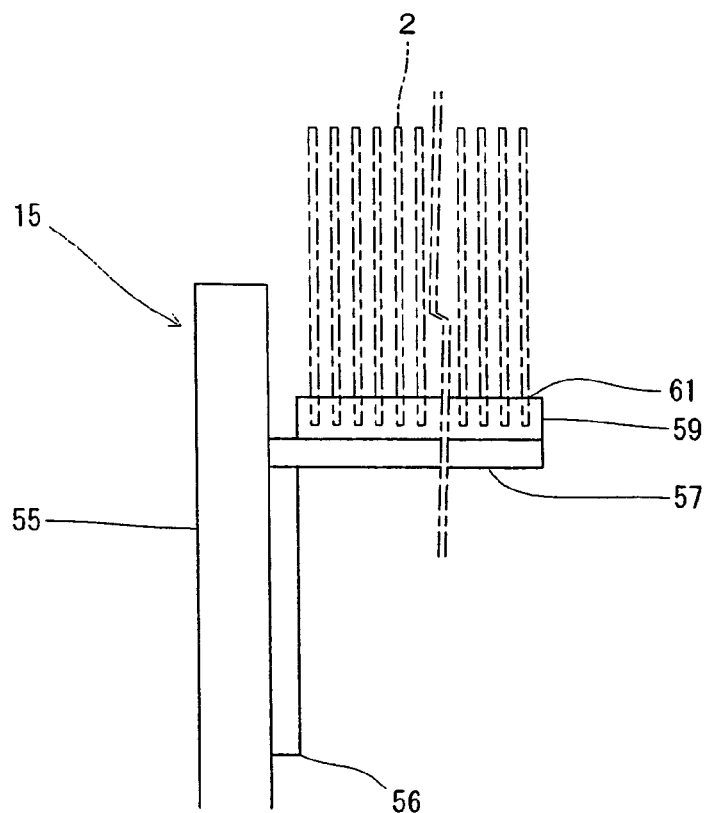
F I G. 9
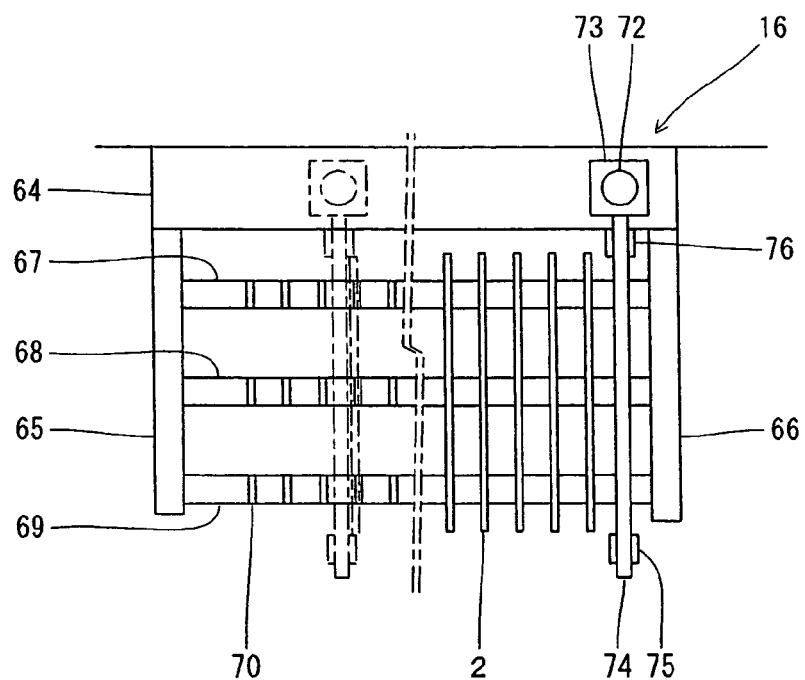
F I G. 10

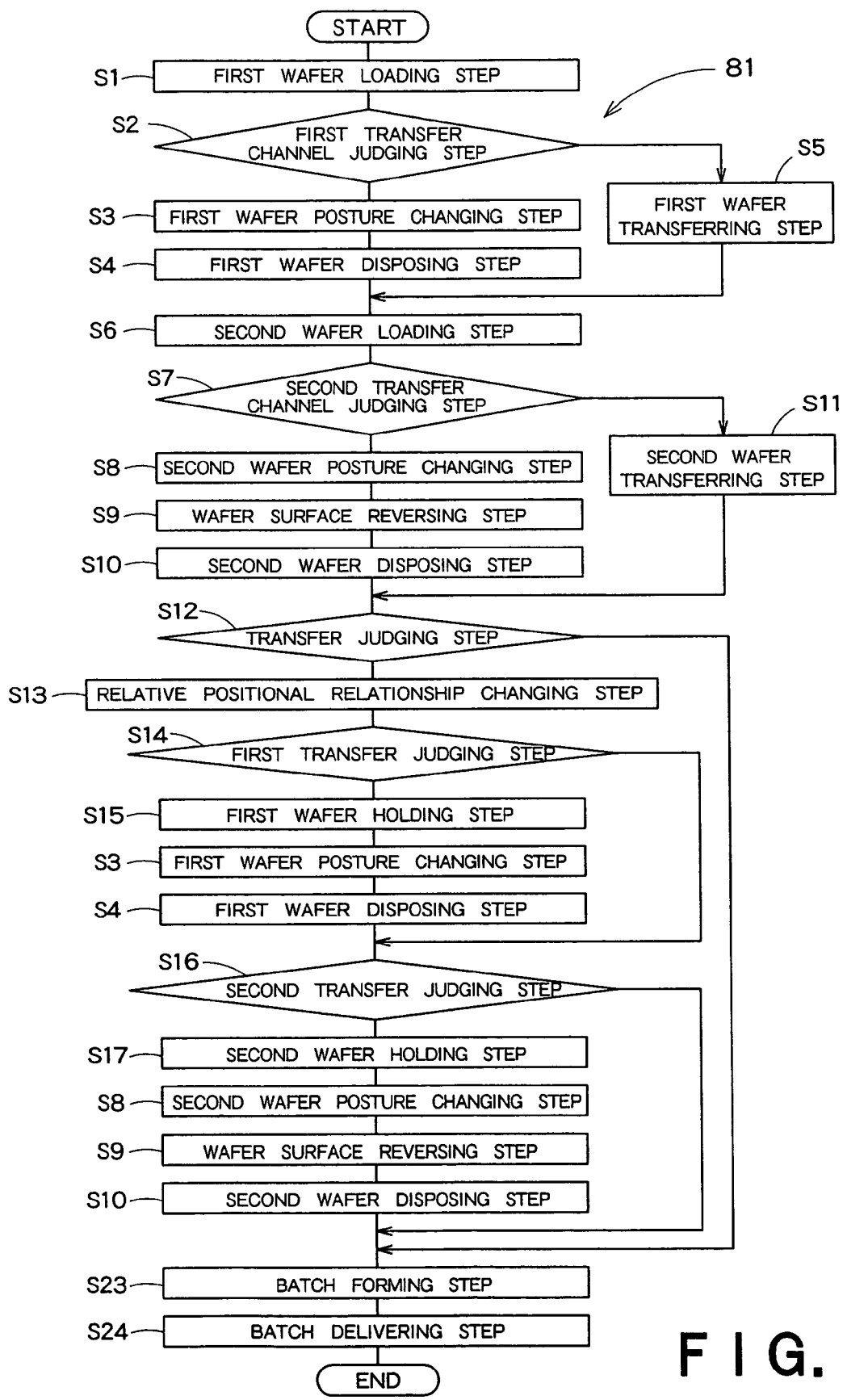
F I G. 14

BATCH FORMING APPARATUS, SUBSTRATE PROCESSING SYSTEM, BATCH FORMING METHOD, AND STORAGE MEDIUM

FIELD OF THE INVENTION

The present invention relates to: a batch forming apparatus that forms a batch of substrates by combining a plurality of substrates that have been taken out from a plurality of carriers each containing therein the substrates in a stacked manner; a substrate processing system including the batch forming apparatus; a batch forming method for forming a batch of substrates; and a storage medium storing a batch forming program for use in the batch forming apparatus.

BACKGROUND OF THE INVENTION

When semiconductor parts and flat display panels are manufactured, various substrate processing steps are generally performed by a substrate processing system, for cleaning and drying front and rear surfaces of semiconductor wafers, liquid crystal substrates, and so on. The substrate processing systems are classified into a wafer-fed type substrate processing system that processes substrates one by one, and a batch type substrate processing system that collectively processes a plurality of substrates. Either one of the substrate processing systems is selected and used, depending on scales or kinds of process steps for semiconductor parts.

In particular, the batch type substrate processing system that collectively processes a plurality of substrates is used with a view to reducing a process time required for each substrate so as to improve a throughput of the process. In order thereto, a further improvement in throughput is desired in the batch type substrate processing system.

For this reason, the batch type substrate processing system can not only collectively process a plurality of substrates (e.g., twenty-five substrates) contained in one carrier, which is used for transferring the substrates from one process step to another process step, but also collectively process the larger number of substrates, for example, fifty substrates, contained in a plurality of carriers (two carriers, for example). In order to achieve this, a batch forming apparatus is used for forming a batch of, e.g., fifty substrates, by combining the substrates contained in a plurality of carriers, e.g., two carriers. In the batch type substrate processing system, the substrates forming such a batch can be collectively processed. To be specific, each batch of substrates is subjected to various substrate processing steps such as a cleaning step, a drying step, etc.

A conventional substrate processing system includes: a carrier loading/unloading part that loads/unloads a carrier in which a plurality of substrates are contained in a stacked manner; a batch forming part that forms a batch of substrates to be collectively processed, by combining the substrates contained in a plurality of carriers; and a substrate processing part that cleans and dries each batch of the substrates. The batch forming part includes: a substrate transfer mechanism capable of simultaneously transferring the substrates contained in one carrier; and a batch forming mechanism that forms a batch of substrates by combining the substrates transferred by the substrate transfer mechanism. In order to form a batch of substrates, the substrate transfer mechanism takes out a plurality of substrates from a first carrier and transfers the same to the batch forming mechanism in which the substrates are turned to be vertically aligned with small gaps therebetween.

Then, the substrate transfer mechanism takes out a plurality of substrates from a second carrier and transfers the same to the batch forming mechanism in which the substrates are turned to be vertically aligned, such that each of the substrates transferred from the second carriers is interposed between the substrates that have been transferred from the first carrier. Thus, a distance between the substrates of the batch of substrates formed by the batch forming mechanism is about one half a distance between the substrates which have been contained in the respective carriers. In this manner, a batch of fifty substrates is formed by the batch forming mechanism in the batch forming part (see, for example, JP2002-64075A).

In the above conventional substrate processing system, the plurality of substrates contained in the respective carriers are merely, sequentially transferred as they are from the carriers to the batch forming mechanism, without changing positional relationships of the substrates relative to each other. Thus, there may be a case in which a batch of substrates formed by the batch forming part lacks one or more substrates, because the substrates contained in the respective carriers fail to successively be aligned in a row with one or more substrates being missing (lacking).

The missing substrate in the batch of substrates may invite troubles in the succeeding processes to be performed in the substrate processing part.

At the cleaning step or the drying step, for example, a plurality of substrates forming a batch are placed in a cleaning bath or drying bath so as to clean or dry the substrates at the same time. However, since the missing substrate in the batch of substrates leads to nonuniform distances between the adjacent substrates, a cleaning liquid or drying vapor contacts the substrates at different rates. In this case, a uniform cleaning effect or drying effect may not be provided.

Particularly at the substrate cleaning step, the batch of substrates is immersed in a cleaning liquid contained in a cleaning bath, under conditions where front surfaces (surface on which a circuit is formed) of the adjacent substrates are opposed to each other while rear surfaces of the adjacent substrates are opposed to each other, in order that contaminants peeled from the rear surface of one substrate are prevented from adhering again to the front surface of the adjacent substrate. However, when the batch of substrates lacks one or more substrates, it occurs that the front surface of the substrate faces the rear surface of the adjacent substrate, so that contaminants of the rear surface may undesirably adhere again to the front surface at the substrate cleaning step.

The present invention has been made in view of the foregoing respect. The object of the present invention is to provide a batch forming apparatus, a substrate processing system, a batch forming method, and a storage medium, that are capable of, even when a plurality of substrates contained in respective carriers fail to successively be aligned in a row with one or more substrates being missing, replacing the missing substrate by changing positional relationships of the substrates relative to each other. According to the present invention, the batch can be prevented from lacking one or more substrates, whereby possible troubles resulting from the missing substrate in the batch can be prevented from occurring in the following batch processes.

SUMMARY OF THE INVENTION

The present invention is a batch forming apparatus for forming a batch of substrates by combining a plurality of substrates that have been taken out from a plurality of carriers each containing therein the plurality of substrates in a stacked manner, comprising: a substrate transfer mechanism that takes out the substrates from each carrier and transfers the substrates; a substrate relative positional relationship changing mechanism that rearranges one or more substrates out of the substrates transferred by the substrate transfer mechanism one by one relative to other substrates to change positional relationships of the substrates relative to each other; and a batch forming mechanism that forms a batch of substrates out of the substrates that have been transferred thereto by the substrate transfer mechanism, with positional relationships of the substrates having been changed relative to each other by the substrate relative positional relationship changing mechanism.

In the batch forming apparatus according to the present invention, it is preferable that the substrate transfer mechanism move along a transfer channel extending between a position at which the substrates are taken out from each carrier by the substrate transfer mechanism and a position at which the batch forming mechanism is disposed; and that the substrate relative positional relationship changing mechanism be disposed on the transfer channel.

In the batch forming apparatus according to the present invention, it is preferable that the substrate transfer mechanism selectively perform either one of the following operations, based on conditions of the plurality of substrates contained in each carrier: an operation in which the substrates contained in each carrier are directly transferred to the batch forming mechanism; and an operation in which the substrates contained in each carrier are firstly transferred to the substrate relative positional relationship changing mechanism to change positional relationships of the substrates relative to each other, and then the substrates are transferred to the batch forming mechanism.

In the batch forming apparatus according to the present invention, it is preferable that the substrate transfer mechanism change, during the transfer of the plurality of substrates, orientations of the substrates from a horizontal direction to a vertical direction.

In the batch forming apparatus according to the present invention, it is preferable that the substrate transfer mechanism transfer the plurality of substrates that have been taken out from each carrier to given substrate receiving positions in the batch forming mechanism or in the substrate relative positional relationship changing mechanism.

In the batch forming apparatus according to the present invention, it is preferable that, when the plurality of substrates that are transferred by the substrate transfer mechanism fail to successively be aligned in a row with one or more substrates being missing, the substrate relative positional relationship changing mechanism rearrange one or more substrates out of the substrates one by one relative to other substrates such that the missing substrate is compensated.

In the batch forming apparatus according to the present invention, it is preferable that, in the course of transferring the plurality of substrates from the plurality of carriers by the substrate transfer mechanism, when the substrates taken out of one of the carriers fail to successively be aligned in a row with one or more substrates being missing, the substrate relative positional relationship changing mechanism rearrange one or more substrates out of the substrates taken out from another carrier one by one relative to other substrates such that the missing substrate is compensated.

The present invention is a substrate processing system comprising: a batch forming apparatus for forming a batch of substrates by combining a plurality of substrates that have been taken out from a plurality of carriers each containing therein a plurality of substrates in a stacked manner; and a substrate processing apparatus that processes the batch of substrates formed by the batch forming apparatus; wherein: the batch forming apparatus includes: a substrate transfer mechanism that takes out the substrates from each carrier and transfers the substrates; a substrate relative positional relationship changing mechanism that rearranges one or more substrates out of the substrates transferred by the substrate transfer mechanism one by one relative to other substrates to change positional relationships of the substrates relative to each other; and a batch forming mechanism that forms a batch of substrates out of the substrates that have been transferred thereto by the substrate transfer mechanism, with positional relationships of the substrates having been changed relative to each other by the substrate relative positional relationship changing mechanism.

In the substrate processing system according to the present invention, it is preferable that the substrate transfer mechanism in the batch forming apparatus move along a transfer channel extending between a position at which the substrates are taken out from each carrier by the substrate transfer mechanism and a position at which the batch forming mechanism is disposed; and that the substrate relative positional relationship changing mechanism be disposed on the transfer channel.

In the substrate processing system according to the present invention, it is preferable that the substrate transfer mechanism in the batch forming apparatus selectively perform either one of the following operations, based on conditions of the plurality of substrates contained in each carrier: an operation in which the substrates contained in each carrier are directly transferred to the batch forming mechanism; and an operation in which the substrates contained in each carrier are firstly transferred to the substrate relative positional relationship changing mechanism to change positional relationships of the substrates relative to each other, and then the substrates are transferred to the batch forming mechanism.

In the substrate processing system according to the present invention, it is preferable that the substrate transfer mechanism in the batch forming apparatus change, during the transfer of the plurality of substrates, orientations of the substrates from a horizontal direction to a vertical direction.

In the substrate processing system according to the present invention, it is preferable that the substrate transfer mechanism in the batch forming apparatus transfer the plurality of substrates that have been taken out from each carrier to given substrate receiving positions in the batch forming mechanism or in the substrate relative positional relationship changing mechanism.

In the substrate processing system according to the present invention, it is preferable that, when the plurality of substrates that are transferred by the substrate transfer mechanism fail to successively be aligned in a row with one or more substrates being missing, the substrate relative positional relationship changing mechanism in the batch forming apparatus rearrange one or more substrates out of the substrates one by one relative to other substrates such that the missing substrate is compensated.

In the substrate processing system according to the present invention, it is preferable that, in the course of transferring the plurality of substrates from the plurality of carriers by the substrate transfer mechanism, when the substrates taken out of one of the carriers fail to successively be aligned in a row with one or more substrates being missing, the substrate relative positional relationship changing mechanism in the batch forming apparatus rearrange one or more substrates out of the substrates taken out from another carrier one by one relative to other substrates such that the missing substrate is compensated.

The present invention is a batch forming method for forming a batch of substrates by combining a plurality of substrates that have been taken out from a plurality of carriers each containing therein the plurality of substrates in a stacked manner, comprising the steps of: taking out the substrates from each carrier and transferring the substrates; rearranging one or more substrates out of the plurality of substrates transferred by a substrate transfer mechanism one by one relative to other substrates to change positional relationships of the substrates relative to each other; transferring the plurality of substrates to a batch forming mechanism, with positional relationships of the substrates having been changed relative to each other by the substrate relative positional relationship changing mechanism; and forming a batch of substrates by the batch forming mechanism out of the plurality of substrates transferred thereto.

In the batch forming method according to the present invention, it is preferable that the method comprise the step of: judging, based on conditions of the plurality of substrates contained in each carrier, whether to change positional relationships of the substrates that have been taken out from each carrier relative to each other; wherein: when it is judged that the positional relationships of the substrates are not changed relative to each other, the substrates that have been taken out from each carrier are directly transferred to the batch forming mechanism in which a batch of substrates are formed out of the substrates transferred thereto.

In the batch forming method according to the present invention, it is preferable that the method comprise the steps of: during the transfer of the plurality of substrates, orientations of the substrates are changed from a horizontal direction to a vertical direction.

In the batch forming method according to the present invention, it is preferable that the plurality of substrates that have been taken out from each carrier be transferred to given substrate receiving positions in the batch forming mechanism or in the relative positional relationship changing mechanism.

In the batch forming method according to the present invention, it is preferable that, when the plurality of substrates that are transferred by the substrate transfer mechanism fail to successively be aligned in a row with one or more substrates being missing, one or more substrates be rearranged out of the substrates by the substrate relative positional relationship changing mechanism one by one relative to other substrates such that the missing substrate is compensated.

In the batch forming method according to the present invention, it is preferable that, in the course of transferring the plurality of substrates from the plurality of carriers by the substrate transfer mechanism, when the substrates taken out of one of the carriers fail to successively be aligned in a row with one or more substrates being missing, one or more substrates be rearranged by the substrate relative positional relationship changing mechanism out of the substrates taken out from another carrier one by one relative to other substrates such that the missing substrate is compensated.

The present invention is a storage medium storing a batch forming program for making a batch forming apparatus to form a batch of substrates, the batch forming apparatus including: a substrate transfer mechanism that takes out the substrates from each carrier and transfers the substrates; a substrate relative positional relationship changing mechanism that rearranges one or more substrates out of the substrates transferred by the substrate transfer mechanism one by one relative to other substrates to change positional relationships of the substrates relative to each other; and a batch forming mechanism that forms a batch of substrates out of the substrates that have been transferred thereto by the substrate transfer mechanism, with positional relationships of the substrates having been changed relative to each other by the substrate relative positional relationship changing mechanism; the batch forming program comprising the steps of: taking out the substrates from each carrier and transferring the substrates; rearranging one or more substrates out of the plurality of substrates by the substrate relative positional relationship changing mechanism, the plurality of substrates being transferred by a substrate transfer mechanism, one by one relative to other substrates to change positional relationships of the substrates relative to each other; transferring the plurality of substrates to a batch forming mechanism, with positional relationships of the substrates having been changed relative to each other by the substrate relative positional relationship changing mechanism; and forming a batch of substrates by the batch forming mechanism out of the plurality of substrates transferred thereto.

In the storage medium according to the present invention, it is preferable that the batch forming program further comprise the steps of: judging, based on conditions of the plurality of substrates contained in each carrier, whether to change positional relationships of the substrates that have been taken out from each carrier relative to each other; and transferring the substrates that have been taken out from each carrier directly to the batch forming mechanism in which a batch of substrates are formed out of the substrates transferred thereto, when it is judged that the positional relationships of the substrates are not changed relative to each other.

In the storage medium according to the present invention, it is preferable that the batch forming program further comprise the step of: changing, during the transfer of the plurality of substrates, orientations of the substrates from a horizontal direction to a vertical direction.

In the storage medium according to the present invention, it is preferable that the batch forming program further comprise the step of: transferring the plurality of substrates that have been taken out from each carrier to given substrate receiving positions in the batch forming mechanism or in the substrate relative positional relationship changing mechanism.

In the storage medium according to the present invention, it is preferable that, when the plurality of substrates that are transferred by the substrate transfer mechanism fail to successively be aligned in a row with one or more substrates being missing, one or more substrates be rearranged out of the substrates by the substrate relative positional relationship changing mechanism one by one relative to other substrates such that the missing substrate is compensated.

In the storage medium according to the present invention, it is preferable that, in the course of transferring the plurality of substrates from the plurality of carriers by the substrate transfer mechanism, when the substrates taken out of one of the carriers fail to successively be aligned in a row with one or more substrates being missing, one or more substrates be rearranged by the substrate relative positional relationship changing mechanism out of the substrates taken out from another carrier one by one relative to other substrates such that the missing substrate is compensated.

According to the batch forming apparatus, the substrate processing system, the batch forming method, and the storage medium according to the present invention, even when a plurality of substrates contained in each carrier fail to successively be aligned in a row with one or more substrates being missing, the missing substrate can be replaced by changing positional relationships of the substrates relative to each other. Since the lack of the substrate in the finished batch can be prevented, troubles resulting from the missing substrate can be prevented from occurring in the succeeding batch processes.

In particular, the substrate relative positional relationship changing mechanism is disposed on the transfer channel. Since this structure reduces an overall transfer distance of the substrate, an overall time period required to form a batch of substrates can be shortened, resulting in an improvement in throughput.

In addition, either one of the following operations is selectively performed based on conditions of the plurality of substrates contained in each carrier. That is, the substrates contained in each carrier are transferred directly to the batch forming mechanism. Alternatively, the substrates contained in each carrier are transferred firstly to the substrate relative positional relationship changing mechanism to change positional relationships of the substrates relative to each other, and then the substrates are transferred to the batch forming mechanism. That is, when there is no need for changing positional relationships of the substrates relative to each other, e.g., when no substrate is missing (lacking) in the plurality of substrates contained in each carrier, the substrates taken out from each carrier are transferred directly to the batch forming mechanism. Thus, an overall time period required for forming a batch can be shortened.

Further, during the transfer of the plurality of substrates taken out from each carrier by the substrate transfer mechanism, the substrate transfer mechanism changes orientations of the substrates from a horizontal direction to a vertical direction. This eliminates the need for additionally disposing an apparatus for changing orientations of the substrates. Thus, an overall structure of the substrate processing system can be simplified, which alleviates labors, time period, and costs required for manufacturing the system.

Furthermore, the plurality of substrates taken out from each carrier are transferred to given substrate receiving positions in the batch forming mechanism or in the substrate relative positional relationship changing mechanism. When a substrate fails to be received in the carrier at an end thereof, there is a possibility that a batch formed by the batch forming mechanism lacks one or more substrates. However, when the substrates are transferred to the batch forming mechanism or the substrate relative positional relationship changing mechanism, the missing substrate in the batch can be readily replaced by displacing positions of the substrates in the batch forming mechanism or the substrate relative positional relationship changing mechanism.

Moreover, when the plurality of substrates that are transferred by the substrate transfer mechanism fail to successively aligned in a row with one or more substrates being missing, the substrate relative positional relationship changing mechanism rearranges one or more substrates out of the wafer one by one relative to other substrates such that the missing substrate is compensated. Since the completed batch can be prevented from lacking a substrate, troubles caused by the missing substrate can be prevented from occurring in the following batch processes.

In addition, in the course of transferring the plurality of substrates from the plurality of carriers by the substrate transfer mechanism, when the substrates taken out of one of the carriers fail to successively be aligned in a row with one or more substrates being missing, the substrate relative positional relationship changing mechanism rearranges one or more substrates out of the substrates taken out from another carrier one by one relative to other substrates such that the missing substrate is compensated. Thus, even when the missing substrate cannot be replaced by changing positional relationships of the substrates relative to each other that are taken out from one of the carriers, the substrate taken out from another carrier can replace the missing substrate in the finished batch.

BRIEF DESCRIPTION OF THE DRAWINGS

FIG. 1 is a plan view of a substrate processing system according to the present invention.

FIG. 2 is a plan view of a batch forming part of the substrate processing system shown in FIG. 1.

FIG. 3 is a front view of the batch forming part shown in FIG. 2.

FIG. 4 is a plan view of a substrate transfer mechanism of the batch forming part shown in FIG. 2.

FIG. 5 is a front view of the substrate transfer mechanism shown in FIG. 4.

FIG. 6 is a cross-sectional view of a wafer holder of the substrate transfer mechanism shown in FIG. 4.

FIG. 9 is a side view of the batch forming mechanism shown in FIG. 8.

FIG. 10 is a plan view of a substrate relative positional relationship changing mechanism of the batch forming part shown in FIG. 2.

FIG. 14 is a flowchart of a batch forming program used in the substrate processing system shown in FIG. 1.

DETAILED DESCRIPTION OF THE PREFERRED EMBODIMENT

Figure 7:
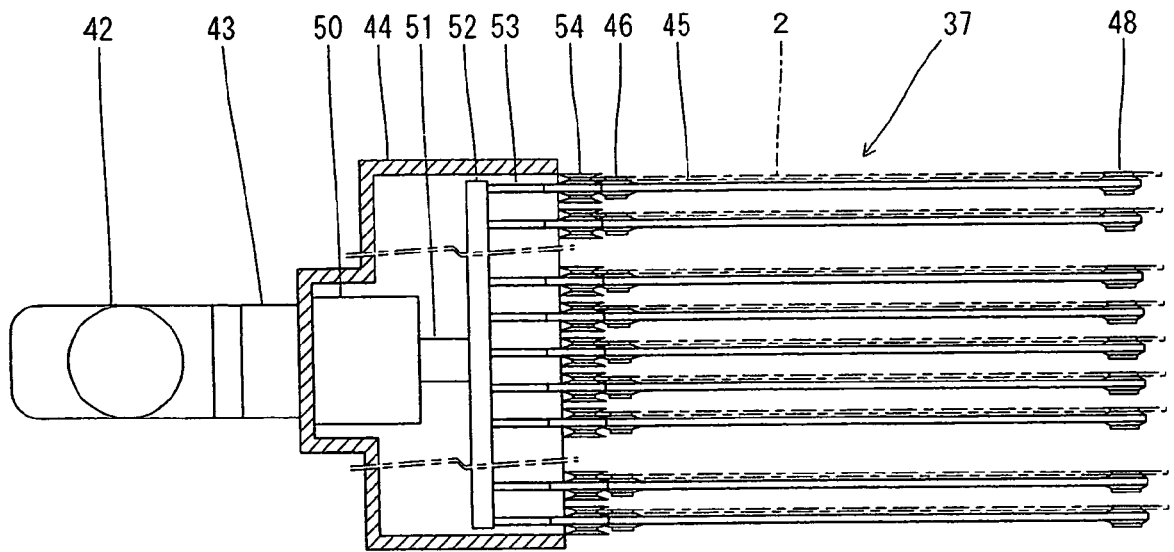
FIG. 7 is a side cross-sectional view of the wafer holder shown in FIG. 6.

The concrete structure of the substrate processing system according to the present invention will be hereinafter described with reference to the accompanied drawings.

As shown in FIG. 1, a substrate processing system 1 includes: a carrier loading/unloading part 4 that loads/unloads a carrier 3 containing a plurality of wafers 2 (substrates); a batch forming part 6 that forms a batch 5 to be collectively processed, by combining the wafers 2 contained in the plurality of carriers 3; and a substrate processing part 7 that cleans and dries the wafers 2 in each batch 5. The carrier loading/unloading part 4, the batch forming part 6, and the substrate processing part 7, that constitute the substrate processing system 1, are adapted to be separately used as independent units, and the substrate processing system 1 may be composed by a combination of the carrier loading/unloading parts 4, the batch forming parts 6, and the substrate processing parts 7. Thus, the batch forming part 6 can independently function as a batch forming apparatus.

The carrier loading/unloading part 4 includes a carrier stage 8 on which the carrier 3 is placed, and a door 9 formed on the carrier stage 8 that sealingly closes the same. A carrier transfer mechanism 10 is disposed inside the door 9. When the wafer 2 is loaded, the carrier 3 placed on the carrier stage 8 is transferred by the carrier transfer mechanism 10 to a carrier stock 11 to be temporality stored therein, and then the carrier 3 is transferred to a carrier table 12.

Reversely to the loading operation, in the carrier loading/unloading part 4, the carrier 3 placed on the carrier table 12, the carrier 3 containing the wafers 2 which have been subjected to a series of processes by the substrate processing part 7, is transferred, according to need, by the carrier transfer mechanism 10 to the carrier stock 11 to be temporality stored therein, and then the carrier 3 is transferred to the carrier stage 8.

In the batch forming part 6, a sealing door 13 is formed between the batch forming part 6 and the carrier loading/unloading part 4. Inside the door 13, the batch forming part 6 includes: a substrate transfer mechanism 14 that simultaneously transfers the plurality of wafers 2 contained in the carrier 3; a batch forming mechanism 15 that forms the batch 5 out of the wafers 2 transferred by the substrate transfer mechanism 14; and a substrate relative positional relationship changing mechanism 16 that changes positional relationships of the wafers 2 relative to each other, which are transferred by the substrate transfer mechanism 14. The batch forming part 6 is provided with a batch transfer mechanism 17 that delivers the batch 5 formed by the batch forming mechanism 15 from the batch forming part 6 to the substrate processing part 7, and transfers the batch 5 inside the substrate processing part 7. The batch forming part 6 has a contained wafer condition detecting sensor 18 that detects conditions of the wafers 2 contained in the carrier 3, and a notch aligner 19 that adjusts in position notches (cutout) of the wafers 2 contained in the carrier 3. The detailed structure of the batch forming part 6 is described below.

The substrate processing part 7 includes a cleaning and drying mechanism 20 that cleans and dries the wafer 2, and a cleaning mechanism 21 that cleans the wafer 2. In the cleaning and drying mechanism 20, there are arranged in parallel a cleaning and drying bath 23 that cleans and dries the batch 5 by vertically moving the same by an elevating apparatus 22, and a cleaning bath 24 that cleans the batch transfer mechanism 17. The cleaning mechanism 21 is provided with: a first to third chemical liquid baths 25, 26, and 27 for processing the batch 5 with a chemical liquid; a first to third deionized water baths 28, 29, and 30 for processing the batch 5 with deionized water; and a first to third transfer apparatuses 31, 32, and 33 for transferring the batch 5 among the first to third chemical liquid baths 25, 26, and 27 and the first to third deionized water baths 28, 29, and 30.

The batch transfer mechanism 17 extends along the cleaning and drying mechanism 20 and the cleaning mechanism 21 in a right and left direction of FIG. 1. A starting end of the batch transfer mechanism 17 is disposed in the batch forming part 6.

In the substrate processing part 7, the batch 5 formed by the batch forming part 6 is transferred by the batch transfer mechanism 17 to the elevating apparatus 22 in the cleaning and drying mechanism 20, and the first to third transfer apparatuses 31, 32, and 33 in the cleaning mechanism 21. Each batch 5 of wafers 2 is processed in the cleaning and drying mechanism 20 and the cleaning mechanism 21. Then, the processed batch 5 is conveyed from the elevating apparatus 22 in the cleaning and drying mechanism 20 and the first to third transfer apparatuses 31, 32, and 33 in the cleaning mechanism 21 to the batch transfer mechanism 17. The batch transfer mechanism 17 transfers the batch 5 again to the batch forming part 6.

That is, in the substrate processing system 1, the wafers 2 contained in each carrier 3 are loaded by the carrier loading/unloading part 4 into the batch forming part 6 in which the batch 5 to be collectively processed is formed. The batch 5 is delivered to the substrate processing part 7 in which the wafers 2 in each of the batches 5 are collectively processed. In the substrate processing system 1, the processed batch 5 is delivered again to the batch forming part 6 in which the wafers 2 constituting the batch 5 are received again in the carrier 3. The carrier 3 containing therein the processed wafers 2 is transferred to the carrier loading/unloading part 4 which then unloads the carrier 3.

As described above, the substrate processing system 1 is so configured that the batch 5 of the plurality of wafers 2 is formed by the batch forming part 6 by combining the plurality of wafers 2 contained in the plurality of carriers 3 loaded by the carrier loading/unloading part 4. For example, the batch 5 of the fifty wafers 2 is formed by combining the twenty-five wafers 2 contained in the two carriers 3. The wafers 2 in each batch 5 are collectively processed by the substrate processing part 7 as described above.

The concrete structure of the batch forming part 6 (batch forming apparatus) is described below.

As shown in FIGS. 2 and 3, the batch forming part 6 includes the door 13 formed on a box-shaped batch forming chamber 34 on the side (lower side of FIG. 2) of the carrier loading/unloading part 4, and the contained wafer condition detecting sensor 18 fixed inside the door 13 in the batch forming chamber 34. The contained wafer condition detecting sensor 18 detects positions and the number of wafers 2 actually contained in the carrier 3, and detects whether the wafers 2 are normally (horizontally) contained in the carrier 3 or not. To be specific, the contained wafer condition detecting sensor 18 irradiates infrared light beams to the wafers 2, and receives reflected light beams reflected by the wafers 2, so as to detect the conditions of the wafers 2 contained in the carrier 3.

The batch forming part 6 is provided with a table 35 disposed at substantially a center of the batch forming chamber 34. In the batch forming part 6 shown in FIG. 2, there are disposed the notch aligner 19 on an upper left part of the table 35, and the substrate transfer mechanism 14 on an upper right part of the table 35. In the batch forming chamber 34 shown in FIG. 2, the batch forming mechanism 15 is disposed on the right side. The starting end of the batch transfer mechanism 17 is positioned near the batch forming mechanism 15 in the batch forming chamber 34. There is disposed the substrate relative positional relationship changing mechanism 16 in the batch forming chamber 34 on the side of the substrate processing part 7 (upper side of FIG. 2).

That is, the batch forming part 6 includes the substrate transfer mechanism 14 disposed at the center of the batch forming chamber 34, and the batch forming mechanism 15 disposed on the right side of the substrate transfer mechanism 14 in FIG. 2. The substrate relative positional relationship changing mechanism 16 is disposed on a transfer channel along which the substrate transfer mechanism 14 passes to transfer the plurality of wafers 2 to the batch forming mechanism 15.

Concrete structures of the substrate transfer mechanism 14, the batch forming mechanism 15, and the substrate relative positional relationship changing mechanism 16, that constitute the batch forming part 6, are described below.

The structure of the substrate transfer mechanism 14 is described with reference to FIGS. 4 to 7. As shown in FIGS. 4 and 5, the substrate transfer mechanism 14 has a multi-axial robot 36 (herein five-axial robot) placed on the table 36, and a wafer holder 37 fixed on the multi-axial robot 36.

The multi-axial robot 36 has a base 38 secured on the table 35, and a rotating table 39 rotatably mounted on the base 38 along a horizontal plane through a first rotating shaft (not shown). In the multi-axial robot 36, a proximal end of a first elevating arm 40 is rotatably mounted on the rotating table 39 through a second rotating shaft (not shown) along a vertical plane parallel to the plane of FIG. 5. A proximal end of a second elevating arm 41 is rotatably mounted on a distal end of the first elevating arm 40 through a third rotating shaft (not shown) along a vertical place parallel to the plane of FIG. 5. A proximal end of a third elevating arm 42 is rotatably mounted on a distal end of the second elevating arm 41 through a fourth rotating shaft (not shown) along a vertical place parallel to the plane of FIG. 5. A proximal end of a rotating arm 43 is rotatably mounted on a distal end of the third elevating arm 42 through a fifth rotating shaft (not shown) along a vertical plane perpendicular to the plane of FIG. 5. The wafer holder 37 is mounted on a distal end of the rotating arm 43.

As shown in FIGS. 6 and 7, the wafer holder 37 includes a casing 44 connected to the distal end of the rotating arm 43, and twenty-five wafer holding plates 45 of a two-pronged fork shape that are disposed in front of an opening of the casing 44 with predetermined gaps therebetween in the vertical direction. A pair of right and left locking pieces 46 and 47 for locking the wafer 2 are attached on a front and rear surfaces of the proximal end of the wafer holding plate 45. A pair of right and left locking pieces 48 and 49 are attached on a front and rear surfaces of the distal end of the wafer holding plate 45. The vertical gaps between the respective wafer holding plate 45 are substantially the same as the distances between the wafers 2 contained in the carrier 3.

The wafer holder 37 is provided with a cylinder 50 disposed inside the casing 44. In the wafer holder 37, a center part of a rear surface of a movable member 52 extending in the vertical direction is attached on a distal end of a rod 51 of the cylinder 50. Twenty-five movable plates 53 are arranged on a front surface of the movable member 52 at predetermined gaps therebetween in the vertical direction. Locking pieces 54 for locking the wafer 2 are attached on a front and rear surfaces of a distal end of the movable plate 53.

The wafer holder 37 holds the wafer 2 by driving the cylinder 50 to move the locking pieces 54 toward a side surface of the wafer 2 which is locked by the locking pieces 46, 47, 48, and 49 attached on the wafer holding plate 45. Due to the locking pieces 46, 47, 48, 49, and 54 attached on the front and rear surfaces of each of the wafer holding plates 45, the wafer holder 37 can hold the wafers 2 by both the front and rear surfaces of each of the wafer holding plates 45. For example, the wafer 2 which is not yet processed by the substrate processing part 7 is held on the front surface side of the wafer holding plate 45, while the wafer 2 which has been processed by the substrate processing part 7 is held on the rear surface side of the wafer holding plate 45. In this manner, it can be prevented that contaminants adhering to the unprocessed wafer 2 adhere again to the processed wafer 2 through the locking pieces 46, 47, 48, 49, and 54.

The substrate transfer mechanism 14 is capable of: taking out the unprocessed wafers 2 from the carrier 3 by suitably changing an orientation of the wafer holder 37 by the multi-axial robot 36; transferring collectively the wafers 2 from the carrier 3 to given wafer receiving positions in the batch forming mechanism 15 or in the substrate relative positional relationship changing mechanism 16; and, during the transfer of the wafers 2, changing orientations of the wafers 2 from the horizontal direction to the vertical direction. In addition, the substrate transfer mechanism 14 is capable of: transferring the processed wafers 2 from the batch forming mechanism 15 to the carrier 3; and, during the transfer of the wafers 2, changing orientations of the wafers 2 from the vertical direction to the horizontal direction.

In the substrate transfer mechanism 14, the wafers 2 contained in the carrier 3 are transferred by the multi-axial robot 36 to the given wafer receiving positions in the batch forming mechanism 15 or in the substrate relative positional relationship changing mechanism 16. Thus, when the batch 5 is formed out of the relatively smaller number of wafers 2 (specifically, the general batch 5 is formed out of the fifty wafers 2, while the batch 5 in this case is formed out of forty wafers 2), the wafers 2 can be arranged near the center part of the batch forming mechanism 15. Therefore, even when the number of wafers 2 to be collectively processed by the substrate processing part 7 is relatively smaller, the wafers 2 can be successively aligned in the batch forming mechanism 15 in substantially a symmetrical manner relative to the center of the batch 5. As a result, properties of the succeeding cleaning and drying processes performed by the substrate processing part 7 can be enhanced.

Figure 8:
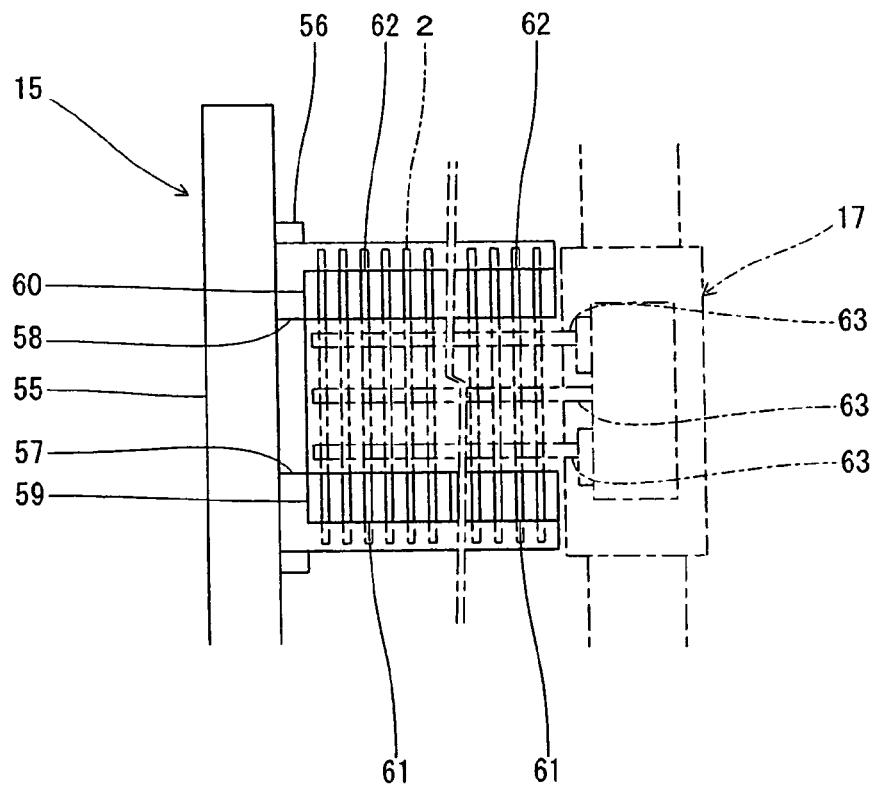
FIG. 8 is a plan view of a batch forming mechanism of the batch forming part shown in FIG. 2.

The structure of the substrate forming mechanism 15 is described with reference to FIGS. 8 and 9. As shown in FIGS. 8 and 9, the batch forming mechanism 15 includes: a base 55; an elevating table 56 movably mounted on the base 55 in the vertical direction; a pair of right and left support arm 57 and 58 mounted on an upper end of the elevating table 56; and wafer holding tables 59 and 60 respectively mounted on the support arm 57 and 58.

The wafer holding tables 59 and 60 respectively have holding grooves 61 and 62 with predetermined gaps therebetween for vertically holding the fifty wafers 2. The gap between the holding grooves 61 and the gap between the holding grooves 62 are substantially one half the distance between the wafers 2 contained in the carrier 3.

In the batch forming mechanism 15, the wafers 2 are arranged on the wafer holding tables 59 and 61 by the substrate transfer mechanism 14 in such a manner that the wafers 2 taken out from the first carrier 3 and the wafers 2 taken out from the second carrier 3 are staggered with the gaps between wafers 2 being half the distance between the wafers 2 that were contained in each carrier 3. That is, the wafers 2 taken out from each carrier 3 are arranged in the wafer holding tables 59 and 60 with gaps that are one half the gaps between the wafers 2 contained in the carrier 3. In this manner, the distance between the wafers 2 can be substantially halved. Alternatively, the wafer holding tables 59 and 60 may be made contractable and extendable. In this case, after the wafers 2 are disposed on the wafer holding tables 59 and 60 by the substrate transfer mechanism 14, the wafer holding tables 59 and 60 are contracted to change the distances between the wafers 2.

Three wafer holding members 63 of the batch transfer mechanism 17 can be inserted between the pair of right and left wafer holding tables 59 and 60 in the batch forming mechanism 15. Thus, the batch 5 of the wafers 2 can be delivered between the wafer holding tables 59 and 60 of the batch forming mechanism 15 and the wafer holding members 63 of the batch transfer mechanism 17.

Figure 11:
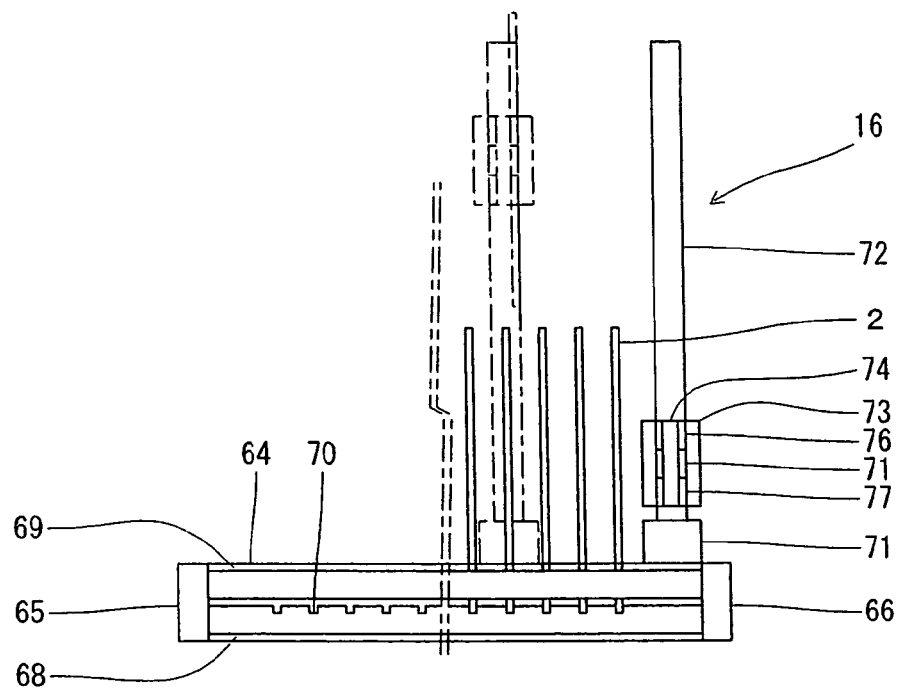
FIG. 11 is a front view of the substrate relative positional relationship changing mechanism of the batch forming part shown in FIG. 10.
Figure 12:
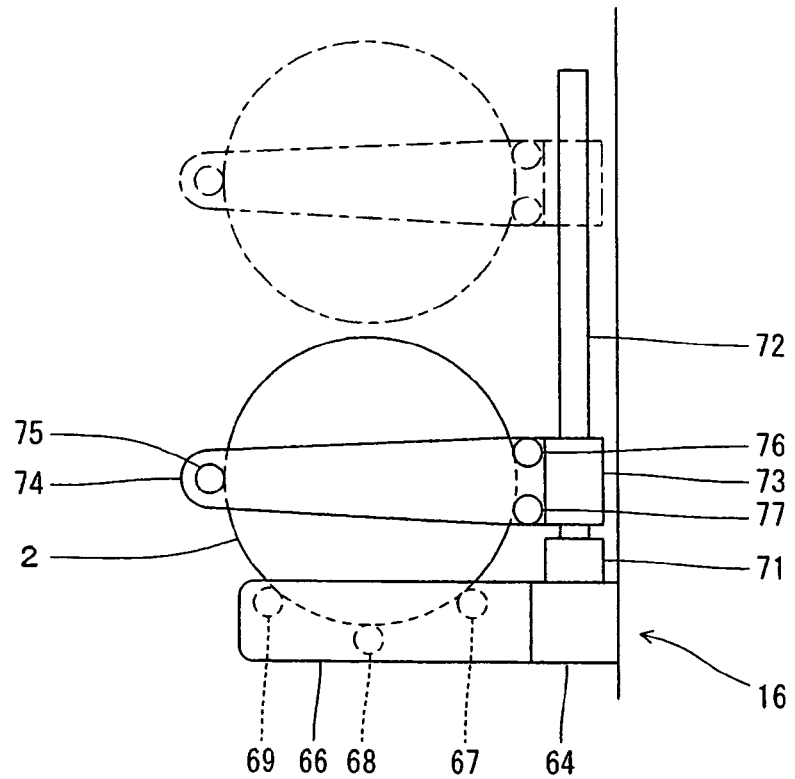
FIG. 12 is a side view of the substrate relative positional relationship changing mechanism of the batch forming part shown in FIG. 10.

The structure of the substrate relative positional relationship changing mechanism 16 is described with reference to FIGS. 10 to 12. As shown in FIGS. 10 to 12, the substrate relative positional relationship changing mechanism 16 includes: a horizontally extending base 64; support plates 65 and 66 mounted on both ends of the base 64; and bar-shaped wafer support members 67, 68, and 69 bridging the support plates 65 and 66. A number of holding grooves 70 with predetermined horizontal gaps therebetween are formed in each outer peripheral surface of the wafer support members 67, 68, and 69 for holding vertically the wafers 2. The gap between the holding grooves 70 is substantially the same as the distance between the wafers 2 contained in the carrier 3.

The substrate relative positional relationship changing mechanism 16 includes: a moving table 71 movably disposed on an upper part of the base 64 in the horizontal direction; a strut 72 fixed on an upper part of the moving table 71; and an elevating table 73 movably mounted on the strut 72 in the vertical direction. A plate-like wafer holding member 74 is mounted on a front surface of the elevating table 73. Locking pieces 75 for locking the wafer 2 are attached on a front and rear surfaces of a distal end of the wafer holding member 74. A pair of upper and lower locking pieces 76 and 77 capable of horizontally moving are attached on a front and rear surfaces of a proximal end of the wafer holding member 74.

In the substrate relative positional relationship changing mechanism 16, the wafers 2, which have been transferred by the substrate transfer mechanism 14 to the wafer holding members 67, 68, and 69, are held thereon one by one with the locking pieces 75, 76, and 77. With a vertical movement of the elevating table 73 and a horizontal movement of the moving table 71, the wafers 2 can be moved one by one, so as to change positional relationships of the wafers 2 relative to each other.

Figure 13:
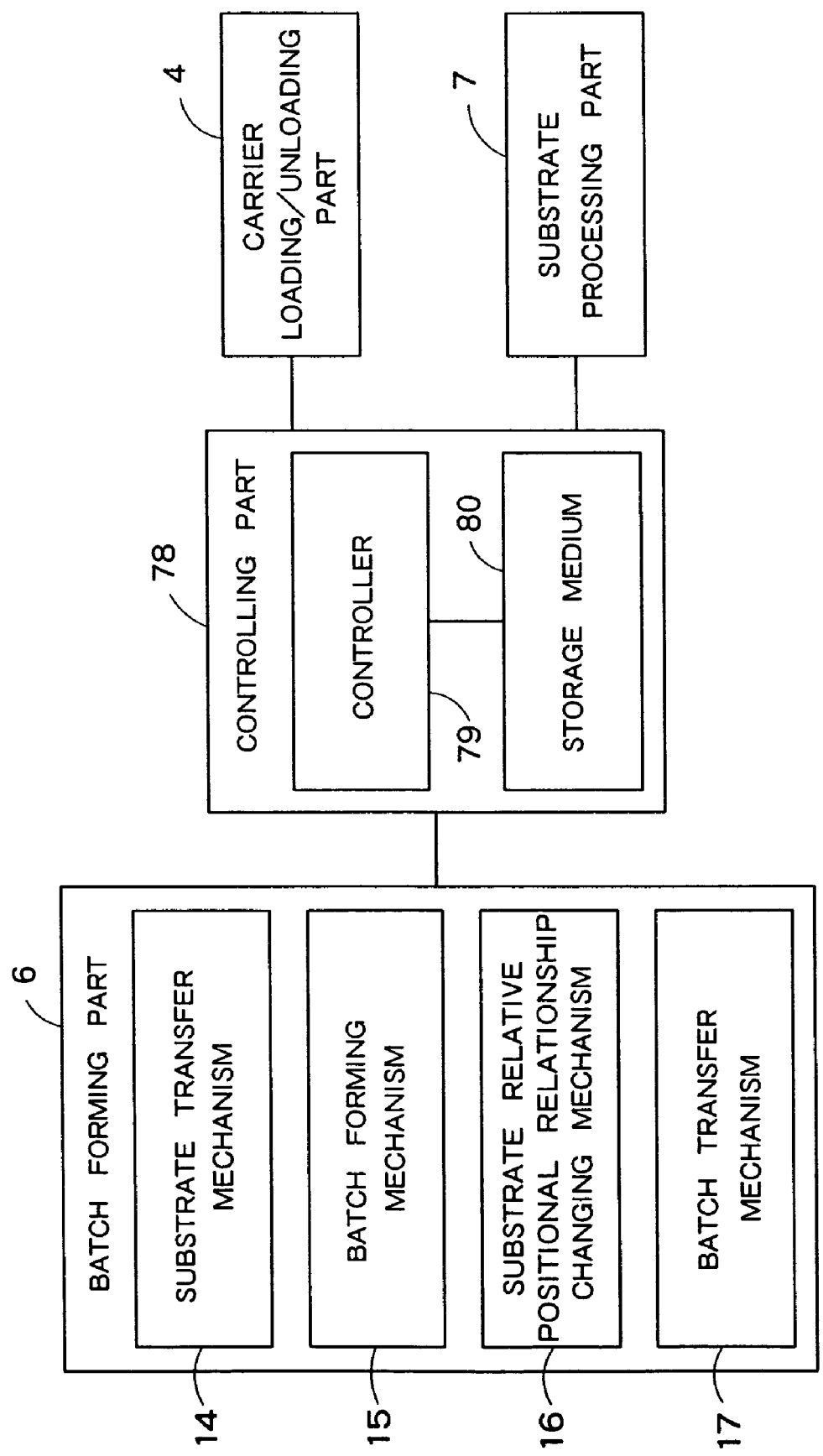
FIG. 13 is a block diagram of a control part of the substrate processing system shown in FIG. 1.

As shown in FIG. 13, operations of the respective substrate transfer mechanism 14, the batch forming mechanism 15, the substrate relative positional relationship changing mechanism 16, and the batch transfer mechanism 17, that form the batch forming part 6, are controlled by a controlling part 78. The controlling part 78 is composed of a controller 79 of a CPU, and a storage medium 80 connected to the controller 79. Not only the batch forming part 6, but also operations of the carrier loading/unloading part 4 and the substrate processing part 7 are controlled by the controlling part 78. The controlling part 78 can be communicatively connected to a host computer that is separate from the substrate processing system 1. The storage medium 80 stores therein various kinds of setting data and a batch forming program (described below) 81. The storage medium 80 may be a memory such as a ROM and RAM, or may be a disc type storage medium such as a hard disc or CD-ROM.

The controlling part 78 controls operations of the substrate transfer mechanism 14, the batch forming mechanism 15, the substrate relative positional relationship changing mechanism 16, and the batch transfer mechanism 17, according to the batch forming program 81 stored in the storage medium 80, so as to form the batch 5 by the batch forming part 6 by combining the plurality of wafers 2 contained in the plurality of carriers 3.

Given hereinbelow as an example to describe the process with reference to FIG. 14 is a case where the batch 5 is formed out of the wafers 2 contained in the two carriers 3, in accordance with the batch forming program 81.

As shown in FIG. 14, according to the batch forming program 81, the wafers 2 are loaded into the batch forming part 6 from the first carrier 3 (first wafer loading step S1).

At the first wafer loading step S1, the first carrier 3 is placed on the carrier table 12 in the carrier loading/unloading part 4. Then, the door 13 is opened, and conditions of the contained wafers 2 are detected by the contained wafer condition detecting sensor 18. Thereafter, an orientation of the wafer holder 37 is changed by the multi-axial robot 36 in the substrate transfer mechanism 14, and the wafers 2 contained in the carrier 3 are taken out by the wafer holding plates 45 of the wafer holder 37. After the door 13 is closed, the notches of the wafers 2 are adjusted in position by the notch aligner 19.

Next, according to the batch forming program 81, it is judged whether the wafers 2 are transferred directly to the batch forming mechanism 15, or the wafers 2 are transferred firstly to the substrate relative positional changing mechanism 16, based on the result detected by the contained wafer condition detecting sensor 18 (first transfer channel judging step S2).

At the first transfer channel judging step S2, the contained wafer condition detecting sensor 18 detects whether one or more wafers 2 contained in the first carrier 3 are missing (lacking) or not. When it is detected that no wafer is missing in the wafers 2, it is selected to transfer the wafers 2 directly to the batch forming mechanism 15. Meanwhile, when it is detected that one or more wafers are missing in the wafers 2, it is selected to transfer the wafers 2 firstly to the substrate relative positional relationship mechanism 16.

When it is selected to transfer the wafers 2 directly to the batch forming mechanism 15 at the first transfer channel judging step S2, orientations of the wafers 2 are changed from the horizontal direction to the vertical direction by the substrate transfer mechanism 14 (first wafer posture changing step S3). Then, the wafers 2 are disposed in the odd-numbered holding grooves 61 and 62 formed in the wafer holding tables 59 and 60 in the batch forming mechanism 15 (first wafer disposing step S4). Following thereto, the batch forming program 81 executes a second wafer loading step S6 described below.

On the other hand, when it is selected to transfer the wafers 2 firstly to the substrate relative positional relationship mechanism 16 at the first transfer channel judging step S2, the wafers 2 are transferred by the substrate transfer mechanism 14 to the holding grooves 70 formed on the left side of the wafer supporting members 67, 68, and 69 in the substrate relative positional changing mechanism 16 (first wafer transferring step S5).

Then, according to the batch forming program 81, the wafers 2 are loaded into the batch forming part 6 from the second carrier 3 (second wafer loading step S6).

Similar to the first wafer loading step S1, at the second wafer loading step S6, the second carrier 3 is placed on the carrier table 12 in the carrier loading/unloading part 4. Then, the door 13 is opened, and conditions of the contained wafers 2 are detected by the contained wafer condition detecting sensor 18. Thereafter, an orientation of the wafer holder 37 is changed by the multi-axial robot 36 in the substrate transfer mechanism 14, and the wafers 2 contained in the carrier 3 are taken out by the wafer holding plates 45 of the wafer holder 37. After the door 13 is closed, the notches of the wafers 2 are adjusted in position by the notch aligner 19.

Next, according to the batch forming program 81, it is judged whether the wafers 2 are transferred directly to the batch forming mechanism 15, or the wafers 2 are transferred firstly to the substrate relative positional changing mechanism 16, based on the result detected by the contained wafer condition detecting sensor 18 (second transfer channel judging step S7).

At the second transfer channel judging step S7, the contained wafer condition detecting sensor 18 detects whether one or more wafers 2 contained in the second carrier 3 are missing (lacking) or not. When it is detected that no wafer is missing in the wafers 2, it is selected to transfer the wafers 2 directly to the batch forming mechanism 15. Meanwhile, when it is detected that one or more wafers are missing in the wafers 2, it is selected to transfer the wafers 2 firstly to the substrate relative positional relationship mechanism 16.

When it is selected to transfer the wafers 2 directly to the batch forming mechanism 15 at the second transfer channel judging step S7, orientations of the wafers 2 are changed from the horizontal direction to the vertical direction by the substrate transfer mechanism 14 (second wafer posture changing step S8). Then, the surfaces of the wafers 2 are reversed (wafer surface reversing step S9). Thereafter, the wafers 2 are disposed in the even-numbered holding grooves 61 and 62 formed in the wafer holding tables 59 and 60 in the batch forming mechanism 15 (second wafer disposing step S10).

According to the batch forming program 81, the surfaces of the wafers 2 that have been contained in the second carrier 3 are reversed at the wafer surface reversing step S9. That is, since the front surfaces of the wafers 2 which have been contained in the first carrier 3 are opposed to the front surfaces of the wafer 2 which have been contained in the second carrier 3, while the rear surfaces of the wafers 2 which have been contained in the first carrier 3 are opposed to the rear surfaces of the wafers 2 which have been contained in the second carrier 3, readhesion of contaminants can be prevented. Depending on the process conditions in the substrate processing part 7, the wafer surface reversing step S9 may be omitted.

On the other hand, when it is selected to transfer the wafers 2 firstly to the substrate relative positional relationship mechanism 16 at the second transfer channel judging step S7, the wafers 2 are transferred by the substrate transfer mechanism 14 to the holding grooves 70 formed on the right side of the wafer supporting members 67, 68, and 69 in the substrate relative positional changing mechanism 16 (second wafer transferring step S11).

According to the batch forming program 81, it is judged whether the wafers 2 are transferred or not to the substrate relative positional relationship changing mechanism 16 at the first transfer channel judging step S2 and the second transfer channel judging step S7 (transfer judging step S12). When it is judged that the wafers 2 are transferred to the substrate relative positional relationship mechanism 16, the substrate relative positional relationship mechanism 16 is driven. To be specific, the substrate relative positional relationship changing mechanism 16 rearranges one or more wafers 2 one by one relative to other wafers 2 to change relative positional relationships of the wafers 2 to each other (relative positional relationship changing step S13). Meanwhile, it is judged that the wafers 2 are not transferred to the substrate relative positional relationship changing mechanism 16, the below-described batch forming step S23 is executed without executing the relative positional relationship changing step S13.

At the relative positional relationship changing step S13, based on the result detected by the contained wafer condition detecting sensor 18, the missing wafer in the wafers 2 contained in the carrier 3 can be replaced by rearranging the rightmost or leftmost wafers 2 to the position of the missing wafer by the substrate relative positional relationship changing mechanism 16. For example, when the wafers 2 contained in the carrier 3 lacks the wafer 2 on the fifth position from the right side, the rightmost wafer 2 is rearranged to the fifth position from the right side, so as to replace the missing fifth wafer 2 from the right side.

At the relative positional relationship changing step S13, when missing wafers 2 cannot be fully replaced by rearranging the wafers 2 taken out only from the first carrier 3, the wafer 2 taken out from the second carrier 3 is rearranged to the position of the wafer 2 in the wafers 2 taken out from the first carrier 3 so as to replace the missing wafers in the wafers taken out from the first carrier 3.

Subsequently, the batch forming program 81 judges whether the wafers 2 contained in the first carrier 3 are transferred or not to the substrate relative positional relationship changing mechanism 16 (first transfer judging step S14). When the wafers 2 are transferred thereto, the wafers 2 held on the holding grooves 70 formed on the left side of the wafer support members 67, 68, and 69 in the substrate relative positional relationship changing mechanism 16 are held by the wafer holder 37 in the substrate transfer mechanism 14 (first wafer holding step S15). After that, the orientations of the wafers 2 are changed from the horizontal direction to the vertical direction by the substrate transfer mechanism 14 (first wafer posture changing step S3). Then, the wafers 2 are disposed on the odd-numbered holding grooves 61 and 62 formed in the wafer holding tables 59 and 60 in the batch forming mechanism 15 (first wafer disposing step S4).

The batch forming program 81 judges whether the wafers 2 contained in the second carrier 3 are transferred or not to the substrate positional relationship changing mechanism 16 (second transfer judging step S16). When the wafers 2 are transferred thereto, the wafers 2 held on the holding grooves 70 formed on the right side of the wafer support members 67, 68, and 69 in the substrate relative positional relationship changing mechanism 16 are held by the wafer holder 37 in the substrate transfer mechanism 14 (second wafer holding step S17). After that, the orientations of the wafers 2 are changed from the horizontal direction to the vertical direction by the substrate transfer mechanism 14 (second wafer posture changing step S8), and the surfaces of the wafers 2 are reversed (wafer surface reversing step S9). Then, the wafers 2 are disposed on the even-numbered holding grooves 61 and 62 formed in the wafer holding tables 59 and 60 in the batch forming mechanism 15 (second wafer disposing step S10).

Finally, according to the batch forming program 81, the batch 5 is formed by the batch forming mechanism 15 (batch forming step S23), and the completed batch 5 is delivered from the batch forming mechanism 15 to the batch transfer mechanism 17 (batch delivering step S24).

According to the batch forming program 81, at the first wafer disposing step S4, the first wafer transferring step S5, the second wafer disposing step S10, and the second wafer transferring step S11, the wafers 2 can be transferred to given positions in the wafer holding tables 59 and 60 of the batch forming mechanism 15 and given positions in the wafer holding members 67, 68, and 69 of the substrate relative positional relationship changing mechanism 16, merely by changing the position and the orientation of the wafer holder 37 by the multi-axial robot 36 in the substrate transfer mechanism 14.

According to the batch forming program 81, at the first transfer channel judging step S2 and the second transfer channel judging step S7, it is selected whether the wafers 2 are transferred directly to the batch forming mechanism 15 or the wafers 2 are transferred firstly to the substrate relative positional relationship changing mechanism 16, based on the result detected by the contained wafer condition detecting sensor 18. However, the present invention is not limited thereto. Alternatively, by grasping conditions of the contained wafers 2 based on information from the host computer connected to the controlling part 78 and information input to the controlling part 78 by the operator, it may be selected whether the wafers 2 are transferred directly to the batch forming mechanism 15 or the wafers 2 are transferred firstly to the substrate relative positional relationship changing mechanism 16.

According to the batch forming program 81, at the first transfer channel judging step S2 and the second transfer channel judging step S7, it is judged that, when no wafer is missing in the wafers 2 contained in the carrier 3, the wafers 2 are transferred directly to the batch forming mechanism 15. However, the present invention is not limited thereto. Alternatively, even when no wafer is missing in the wafers 2 contained in the carrier 3, the wafers 2 may be transferred firstly to the substrate relative positional relationship changing mechanism 16. For example, when the number of wafers 2 taken out from the first carrier 3 differs from the number of wafers 2 taken out from the second carrier 3, the wafers 2 taken out from the respective carriers 3 are transferred firstly to the substrate relative positional relationship changing mechanism 16 in which positional relationships of the wafers 2 are changed relative to each other, and thereafter the wafers 2 may be transferred to the batch forming mechanism 15. That is, in a case where the number of wafers 2 taken out from the first carrier 3 differs from the number of wafers taken out from the second carrier 3, when the wafers 2 taken out from the respective carriers 3 are transferred directly to the batch forming mechanism 15, the batch 5 formed by the batch forming mechanism 15 lacks one or more wafers 2. However, since positional relationships of the wafers 2 are changed relative to each other by the substrate relative positional relationship changing mechanism 16, it can be prevented that the batch 5 formed by the batch forming mechanism 15 lacks one or more wafers 2.

The storage medium 80 in the controlling part 78 stores therein initial conditions of the wafers 2 contained in each carrier 3, and a batch forming history indicating how the batch 5 is formed by the substrate transfer mechanism 14, the batch forming mechanism 15, and the substrate relative positional relationship changing mechanism 16. After the wafers 2 are processed by the substrate processing part 7, the controlling part 78 controls the substrate transfer mechanism 14 and the batch forming mechanism 15 such that the wafers 2 are again received in the original carrier 3, based on the initial conditions and the batch forming history stored in the storage medium 80. Alternatively, the controlling part 78 may control the respective mechanisms such that the wafers 2 processed by the substrate processing part 7 are received in the carrier 3 which is different from the carrier in which the wafers 2 have been contained before the wafers are formed into the batch 5, based on instructions from the host computer or instructions from the operator.

As has been described above, the substrate processing system 1 as structured above includes: the substrate transfer mechanism 14 that takes out the plurality of wafers 2 from each carrier 3 and transfers the wafers 2; the substrate relative positional relationship changing mechanism 16 that rearranges one or more substrates out of the wafers 2 transferred by the substrate transfer mechanism 14 one by one to change positional relationships of the wafers 2 relative to each other; and the batch forming mechanism 15 that forms the batch 5 from the wafers 2 whose positions have been changed relative to each other by the substrate relative positional relationship changing mechanism 16 and have been transferred again by the substrate transfer mechanism 14. Thus, the batch 5 can be formed by optionally changing positional relationships of the wafers 2 relative to each other by the substrate relative positional relationship changing mechanism 16.

Due to the above structure, even when the plurality of wafers 2 contained in each carrier 3 lack one or more wafers 2, for example, the missing wafer 2 can be replaced by changing positional relationships of the wafers 2 relative to each other by the substrate relative positional relationship changing mechanism 16. Therefore, the batch 5 can be prevented from lacking one or more wafers 2, whereby possible troubles, such as defective cleaning process and drying process, resulting from the missing wafer 2 in the batch 5 can be prevented from occurring in the following batch processes.

Further, the substrate relative positional relationship changing mechanism 16 is disposed on the transfer channel of the substrate transfer mechanism 14. Since this structure can reduce an overall transfer distance of the wafer 2, an overall time period required to form a batch of substrates can be shortened, resulting in an improvement in throughput.

In addition, either one of the following operations is selectively performed based on conditions of the plurality of wafers 2 contained in each carrier 3. That is, the wafers 2 contained in each carrier 3 are transferred directly to the batch forming mechanism 15. Alternatively, the wafers 2 contained in each carrier 3 are transferred firstly to the substrate relative positional relationship changing mechanism 16 to change positional relationships of the wafers 2 relative to each other, and then the wafers 2 are transferred to the bath forming mechanism 15. That is, when there is no need for changing positional relationships of the wafers 2 relative to each other, e.g., when no wafer is missing (lacking) in the plurality of wafers contained in each carrier 3, the wafers 2 taken out from each carrier 3 are transferred directly to the batch forming mechanism 15. Thus, an overall time period required for forming a batch can be shortened.

Further, during the transfer of the plurality of wafers 2 taken out from each carrier 3 by the substrate transfer mechanism 14, the substrate transfer mechanism 14 changes orientations of the wafers 2 from a horizontal direction to a vertical direction. This eliminates the need for additionally disposing an apparatus for changing orientations of the wafers 2. Thus, an overall structure of the substrate processing system 1 can be simplified, which alleviates labors, time period, and costs required for manufacturing the system 1.

Furthermore, the plurality of wafers 2 taken out from each carrier 3 are transferred to given substrate receiving positions in the batch forming mechanism 15 or in the substrate relative positional relationship changing mechanism 16. When the wafer 2 fails to be received in the carrier 3 at an end thereof, there is a possibility that the batch 5 formed by the batch forming mechanism 15 lacks one or more wafers. However, when the wafers 2 are transferred to the batch forming mechanism 15 or the substrate relative positional relationship changing mechanism 16, the missing wafer in the batch 5 can be readily replaced by displacing positions of the wafers 2 in the batch forming mechanism 15 or the substrate relative positional relationship changing mechanism 16 in this case.

Moreover, when the plurality of wafers 2 that are transferred by the substrate transfer mechanism 14 fail to successively aligned in a row with one or more wafers 2 being missing, the substrate relative positional relationship changing mechanism 16 rearranges one or more wafers 2 out of the wafers 2 one by one relative to other wafers 2 such that the missing wafer 2 is compensated. Since the completed batch 5 can be prevented from lacking the wafer 2, troubles caused by the missing wafer can be prevented from occurring in the succeeding batch processes.

In addition, in the course of transferring the plurality of wafers 2 from the plurality of carriers 3 by the substrate transfer mechanism 14, when the wafers 2 taken out of one of the carriers 3 fail to successively be aligned in a row with one or more wafers 2 being missing, the substrate relative positional relationship changing mechanism 16 rearranges one or more wafers 2 out of the wafers 2 taken out from another carrier 3 one by one relative to other wafers 2 such that the missing wafer 2 is compensated. Thus, even when the missing wafer 2 cannot be replaced by changing positional relationships of the wafers 2 relative to each other that are taken out from one of the carriers 3, the wafer 2 taken out from another carrier 3 can replace the missing wafer 2 in the finished batch 5.

The use of the multi-axial robot 36 as the substrate transfer mechanism 14 facilitates: to transfer of the wafers 2 among the carrier 3, the batch forming mechanism 15, and the substrate relative positional relationship changing mechanism 16; to collectively change the orientations of the wafers 2 during a transfer thereof; and to transfer the wafers 2 to given substrate receiving positions in the batch forming mechanism 15 or the substrate relative positional relationship changing mechanism 16. As a result, the batch 5 can be easily formed with a high degree of freedom.

The invention claimed is:

1. A batch forming apparatus for forming a batch of substrates by combining a plurality of substrates that have been taken out from a plurality of carriers each containing therein the plurality of substrates in a stacked manner, comprising:
a substrate transfer mechanism that takes out the substrates from each carrier and transfers the substrates;
a substrate relative positional relationship changing mechanism that has a wafer support member, the wafer support member being capable of receiving substrates transferred by the substrate transfer mechanism, the substrate relative positional relationship changing mechanism being capable of rearranging one or more substrates on the wafer support member one by one relative to other substrates on the wafer support member such that positional relationships of the substrates are changed thereon; and
a batch forming mechanism that forms a batch of substrates out of the substrates that have been transferred thereto by the substrate transfer mechanism,
wherein the substrate relative positional relationship changing mechanism has a horizontally extending base, on which the substrates may be respectively placed in the vertical direction, and a wafer holding member capable of holding a substrate, the wafer holding member being capable of moving vertically and horizontally, and the wafer holding member being capable of rearranging one or more substrates on the horizontally extending base one by one relative to other substrates on the horizontally extending base such that positional relationships of the substrates are changed thereon;
wherein the wafer holding member moves vertically when the wafer holding member picks up the substrate placed on the horizontally extending base or places the substrate on the horizontally extending base; and
wherein the wafer holding member moves over the substrates placed on the horizontally extending base when the wafer holding member moves horizontally while holding the substrate.

2. The batch forming apparatus according to claim 1, wherein:
the substrate transfer mechanism moves along a transfer channel extending between a position at which the substrates are taken out from each carrier by the substrate transfer mechanism and a position at which the batch forming mechanism is disposed; and
the substrate relative positional relationship changing mechanism is disposed on the transfer channel.

3. The batch forming apparatus according to claim 1, wherein:
the substrate transfer mechanism selectively performs either one of the following operations, based on conditions of the plurality of substrates contained in each carrier: an operation in which the substrates contained in each carrier are directly transferred to the batch forming mechanism; and an operation in which the substrates contained in each carrier are firstly transferred to the substrate relative positional relationship changing mechanism to change positional relationships of the substrates relative to each other, and then the substrates are transferred to the batch forming mechanism.

4. The batch forming apparatus according to claim 1, wherein:
the substrate transfer mechanism changes, during the transfer of the plurality of substrates, orientations of the substrates from a horizontal direction to a vertical direction.

5. The batch forming apparatus according to claim 1, wherein:
the substrate transfer mechanism transfers the plurality of substrates that have been taken out from each carrier to given substrate receiving positions in the batch forming mechanism or in the substrate relative positional relationship changing mechanism.

6. The batch forming apparatus according to claim 1, wherein:
when the plurality of substrates that are transferred by the substrate transfer mechanism fail to successively be aligned in a row with one or more substrates being missing, the substrate relative positional relationship changing mechanism rearranges one or more substrates out of the substrates one by one relative to other substrates such that the one or more missing substrates are compensated.

7. The batch forming apparatus according to claim 1, wherein:
in the course of transferring the plurality of substrates from the plurality of carriers by the substrate transfer mechanism, when the substrates taken out of one of the carriers fail to successively be aligned in a row with one or more substrates being missing, the substrate relative positional relationship changing mechanism rearranges one or more substrates out of the substrates taken out from another carrier one by one relative to other substrates such that the one or more missing substrates are compensated.

8. The batch forming apparatus according to claim 1, wherein:
locking pieces for locking the substrate are attached on front and rear surfaces of a distal end of the wafer holding member.

9. A batch forming method for forming a batch of substrates, by using a batch forming apparatus according to claim 1, by combining a plurality of substrates that have been taken out from a plurality of carriers each containing therein the plurality of substrates in a stacked manner, comprising the steps of:
providing the batch forming apparatus of claim 1;
taking out the substrates from each carrier and transferring the substrates on to a wafer support member;
judging, based on conditions of the plurality of substrates contained in each carrier, whether to change positional relationships of the substrates that have been taken out from each carrier relative to each other;
when it is judged that positional relationships of the substrates are to be changed relative to each other, rearranging one or more substrates out of the plurality of substrates on the wafer support member one by one such that positional relationships of the substrates are changed thereon;
transferring the plurality of substrates to a batch forming mechanism, with positional relationships of the substrates having been changed; and
forming a batch of substrates by the batch forming mechanism out of the plurality of substrates transferred thereto.

10. The batch forming method according to claim 9, wherein:

when it is judged that the positional relationships of the substrates are not changed relative to each other, the substrates that have been taken out from each carrier are directly transferred to the batch forming mechanism in which a batch of substrates are formed out of the substrates transferred thereto.

11. The batch forming method according to claim 9, further comprising the step of:

during the transfer of the plurality of substrates, changing the orientations of the substrates from a horizontal direction to a vertical direction.

12. The batch forming method according to claim 9, wherein:

the plurality of substrates that have been taken out from each carrier are transferred to given substrate receiving positions in the batch forming mechanism or in the relative positional relationship changing mechanism.

13. The batch forming method according to claim 9, wherein:

when the plurality of substrates that are transferred by the substrate transfer mechanism fail to successively be aligned in a row with one or more substrates being missing, one or more substrates is rearranged out of the substrates by the substrate relative positional relationship changing mechanism one by one relative to other substrates such that the one or more missing substrates are compensated.

14. The batch forming method according to claim 9, wherein:

in the course of transferring the plurality of substrates from the plurality of carriers by the substrate transfer mechanism, when the substrates taken out of one of the carriers fail to successively be aligned in a row with one or more substrates being missing, one or more substrates is rearranged by the substrate relative positional relationship changing mechanism out of the substrates taken out from another carrier one by one relative to other substrates such that the one or more missing substrates are compensated.

15. A substrate processing system comprising:

a batch forming apparatus for forming a batch of substrates by combining a plurality of substrates that have been taken out from a plurality of carriers each containing therein a plurality of substrates in a stacked manner; and a substrate processing apparatus that processes the batch of substrates formed by the batch forming apparatus; wherein:

the batch forming apparatus includes:

a substrate transfer mechanism that takes out the substrates from each carrier and transfers the substrates;

a substrate relative positional relationship changing mechanism that has a wafer support member, the wafer support member being capable of receiving substrates transferred by the substrate transfer mechanism, the substrate relative positional relationship changing mechanism being capable of rearranging one or more substrates on the wafer support member one by one relative to other substrates on the wafer support member such that positional relationships of the substrates are changed thereon; and a batch forming mechanism that forms a batch of substrates out of the substrates that have been transferred thereto by the substrate transfer mechanism, wherein the substrate relative positional relationship changing mechanism has a horizontally extending base, on which the substrates may be respectively placed in the vertical direction, and a wafer holding member capable of holding a substrate, the wafer holding member being capable of moving vertically and horizontally, and the wafer holding member being capable of rearranging one or more substrates on the horizontally extending base one by one relative to other substrates on the horizontally extending base such that positional relationships of the substrates are changed thereon;

wherein the wafer holding member moves vertically when the wafer holding member picks up the substrate placed on the horizontally extending base or places the substrate on the horizontally extending base; and wherein the wafer holding member moves over the substrates placed on the horizontally extending base when the wafer holding member moves horizontally while holding the substrate.

16. The substrate processing system according to claim 15, wherein:

locking pieces for locking the substrate are attached on front and rear surfaces of a distal end of the wafer holding member.

17. The substrate processing system according to claim 15, wherein:

the substrate transfer mechanism in the batch forming apparatus moves along a transfer channel extending between a position at which the substrates are taken out from each carrier by the substrate transfer mechanism and a position at which the batch forming mechanism is disposed; and the substrate relative positional relationship changing mechanism is disposed on the transfer channel.

18. The substrate processing system according to claim 15, wherein:

the substrate transfer mechanism in the batch forming apparatus selectively performs either one of the following operations, based on conditions of the plurality of substrates contained in each carrier: an operation in which the substrates contained in each carrier are directly transferred to the batch forming mechanism; and an operation in which the substrates contained in each carrier are firstly transferred to the substrate relative positional relationship changing mechanism to change positional relationships of the substrates relative to each other, and then the substrates are transferred to the batch forming mechanism.

19. The substrate processing system according to claim 15, wherein:

the substrate transfer mechanism in the batch forming apparatus changes, during the transfer of the plurality of substrates, orientations of the substrates from a horizontal direction to a vertical direction.

20. The substrate processing system according to claim 15, wherein:

the substrate transfer mechanism in the batch forming apparatus transfers the plurality of substrates that have been taken out from each carrier to given substrate receiving positions in the batch forming mechanism or in the substrate relative positional relationship changing mechanism.

21. The substrate processing system according to claim 15, wherein:

when the plurality of substrates that are transferred by the substrate transfer mechanism fail to successively be aligned in a row with one or more substrates being missing, the substrate relative positional relationship changing mechanism in the batch forming apparatus rearranges one or more substrates out of the substrates one by one relative to other substrates such that the missing substrate is compensated.

22. The substrate processing system according to claim 15, wherein
in the course of transferring the plurality of substrates from the plurality of carriers by the substrate transfer mechanism, when the substrates taken out of one of the carriers fail to successively be aligned in a row with one or more substrates being missing, the substrate relative positional relationship changing mechanism in the batch forming apparatus rearranges one or more substrates out of the substrates taken out from another carrier one by one relative to other substrates such that the missing substrate is compensated.

23. A storage medium storing batch forming instructions for making a batch forming apparatus form a batch of substrates,
the batch forming apparatus including: a substrate transfer mechanism that takes out the substrates from each carrier and transfers the substrates; a substrate relative positional relationship changing mechanism that has a wafer support member, the wafer support member being capable of receiving substrates transferred by the substrate transfer mechanism, the substrate relative positional relationship changing mechanism being capable of rearranging one or more substrates out of the substrates supported by the wafer support member one by one relative to other substrates on the wafer support member such that positional relationships of the substrates are changed thereon; and a batch forming mechanism that forms a batch of substrates out of the substrates that have been transferred thereto by the substrate transfer mechanism,
the batch forming instructions causing a controller of the batch forming apparatus to carry out steps of:
taking out the substrates from each carrier and transferring the substrates;
judging, based on conditions of the plurality of substrates contained in each carrier, whether to change positional relationships of the substrates that have been taken out from each carrier relative to each other,
when it is judged that positional relationships of the substrates are to be changed relative to each other, rearranging one or more substrates out of the plurality of substrates by the substrate relative positional relationship changing mechanism, the plurality of substrates being transferred by the substrate transfer mechanism, one by one relative to other substrates to change positional relationships of the substrates relative to each other;
transferring the plurality of substrates to the batch forming mechanism, with positional relationships of the substrates having been changed relative to each other by the substrate relative positional relationship changing mechanism; and
forming a batch of substrates by the batch forming mechanism out of the plurality of substrates transferred thereto;
wherein the substrate relative positional relationship changing mechanism has a horizontally extending base, on which the substrates may be respectively placed in the vertical direction, and a wafer holding member capable of holding a substrate, the wafer holding member being capable of moving vertically and horizontally, and the wafer holding member being capable of rearranging one or more substrates on the horizontally extending base one by one relative to other substrates on the horizontally extending base such that positional relationships of the substrates are changed thereon;
wherein the wafer holding member moves vertically when the wafer holding member picks up the substrate placed on the horizontally extending base or places the substrate on the horizontally extending base; and
wherein the wafer holding member moves over the substrates placed on the horizontally extending base when the wafer holding member moves horizontally while holding the substrate.

24. The storage medium according to claim 23, wherein:
the batch forming instructions further cause the controller of the batch forming apparatus to carry out the steps of:
transferring the substrates that have been taken out from each carrier directly to the batch forming mechanism in which a batch of substrates are formed out of the substrates transferred thereto, when it is judged that the positional relationships of the substrates are not changed relative to each other.

25. The storage medium according to claim 23, wherein:
the batch forming instructions further cause the controller of the batch forming apparatus to carry out the step of:
changing, during the transfer of the plurality of substrates, orientations of the substrates from a horizontal direction to a vertical direction.

26. The storage medium according to claim 23, wherein:
the batch forming instructions further cause the controller of the batch forming apparatus to carry out the step of:
transferring the plurality of substrates that have been taken out from each carrier to given substrate receiving positions in the batch forming mechanism or in the substrate relative positional relationship changing mechanism.

27. The storage medium according to claim 23, wherein:
when the plurality of substrates that are transferred by the substrate transfer mechanism fail to successively be aligned in a row with one or more substrates being missing, one or more substrates is rearranged out of the substrates by the substrate relative positional relationship changing mechanism one by one relative to other substrates such that the one or more missing substrates are compensated.

28. The storage medium according to claim 23, wherein:
in the course of transferring the plurality of substrates from the plurality of carriers by the substrate transfer mechanism, when the substrates taken out of one of the carriers fail to successively be aligned in a row with one or more substrates being missing, one or more substrates is rearranged by the substrate relative positional relationship changing mechanism out of the substrates taken out from another carrier one by one relative to other substrates such that the one or more missing substrates are compensated.

29. The storage medium according to claim 23, wherein:
locking pieces for locking the substrate are attached on a front and rear surfaces of a distal end of the wafer holding member.

* * * * *